United States Patent
Kiesbauer

(10) Patent No.: US 8,820,349 B2
(45) Date of Patent: Sep. 2, 2014

(54) CONTROL VALVE FOR ADJUSTING A PROCESS MEDIUM FLOW OF A TECHNICAL PROCESS INSTALLATION

(71) Applicant: Joerg Kiesbauer, Eppertshausen (DE)

(72) Inventor: Joerg Kiesbauer, Eppertshausen (DE)

(73) Assignee: Samson Aktiengesellschaft, Frankfurt (DE)

( * ) Notice: Subject to any disclaimer, the term of this patent is extended or adjusted under 35 U.S.C. 154(b) by 0 days.

(21) Appl. No.: 13/760,415

(22) Filed: Feb. 6, 2013

(65) Prior Publication Data

US 2013/0199637 A1    Aug. 8, 2013

(30) Foreign Application Priority Data

Feb. 6, 2012    (DE) .......................... 10 2012 002 316

(51) Int. Cl.
*H02N 2/00*    (2006.01)

(52) U.S. Cl.
USPC ............................ 137/560; 251/121; 310/306

(58) Field of Classification Search
USPC ........... 310/306; 137/551, 554, 560; 251/120, 251/121
See application file for complete search history.

(56) References Cited

U.S. PATENT DOCUMENTS

| 952,187 | A | * | 3/1910 | Donnelly | ....................... 251/120 |
| 1,891,374 | A | * | 12/1932 | Ehemann | ....................... 251/120 |
| 5,586,745 | A | * | 12/1996 | Knapp | ........................... 251/121 |
| 6,544,561 | B2 | * | 4/2003 | Beckett | ......................... 424/686 |
| 7,739,994 | B2 | * | 6/2010 | Mcgilvray et al. | .......... 123/193.5 |

FOREIGN PATENT DOCUMENTS

| DE | 102004004930 | * | 8/2005 |
| DE | 102006011503 |   | 9/2007 |

\* cited by examiner

*Primary Examiner* — John Rivell
*Assistant Examiner* — Angelisa Hicks
(74) *Attorney, Agent, or Firm* — Schiff Hardin LLP

(57) ABSTRACT

In a control valve for adjusting a process medium flow of a technical process installation, a housing is provided with an interior to be traversed by a process medium. A valve seat is disposed inside the housing interior. A valve member is provided obstructing or clearing the valve seat wherein a flow cross section of the control valve can be altered according to a relative position between the valve member and the valve seat for adjusting the process medium flow to initiate a pressure change in the process medium flow between an upstream and a downstream duct section. An electrical consumer is provided. A thermoelectric element is coupled to supply electrical power to the electrical consumer. The thermoelectric element is disposed at a position in the housing interior for generating the electrical power resulting from a temperature difference that accompanies a pressure difference at a location of said position of the thermoelectric element.

24 Claims, 3 Drawing Sheets

CONTROL VALVE FOR ADJUSTING A PROCESS MEDIUM FLOW OF A TECHNICAL PROCESS INSTALLATION

BACKGROUND

The disclosure relates to a control valve for adjusting a process medium flow of a technical process installation, like a refinery, a food processing plant like a brewery, or a petrochemical plant or the like.

Technical process installations are meant to work automatically to a large extent, which is why process parameters of the process medium flow, like the position of the control valve, are very important control variables. These parameters are commonly communicated to a central control unit or to a positioner controlling the control valve. However, for many of the employed control valves an electrical infrastructure for generating, transmitting and/or processing information signals is not readily provided. It is known, for example, to employ a wireless communication. In locations where accessibility is enabled for a simple fitting of signal lines or where a high safety standard for signal transmission is required, the classical signal transmission via wires is to be preferred.

Principally, for all processes of signal generation and transmission there is the problem to provide a power supply that is battery-less and ignition-proof as far as possible. In particular for pneumatically driven control valves there are endeavours to fit, for example, small turbines into the pneumatic operating actuators, thus converting the pneumatic energy into electric power. However, for such air-powered mini turbines the principle problem exists that in case of failing air pressure supply a continuous power supply is not possible without use of a battery. The usage of mini turbines within the process medium flow is also not uncritical in so far as critical conditions prevail within the process fluid, in particular if the process fluid contains particles. Furthermore, hardly any long-term studies exist about these types of systems which provide for a reliable supply of power.

A continuous power supply by means of an energy converter for electro-pneumatically operated positioners for use in technical process installations is known from DE 10 2006 011 503 A1. By means of a piezoelectric element, a thermoelectric element or a mechanical turbine, electrical power is to be provided out of the air pressure supply by utilizing a pressure difference between ambient air and a pressure of the air supply for actuating a control valve.

In this technology the self-sufficient continuous power supply achieved depends on the continuous presence of pressurized air as an energy supply. However, in technical processing installations it frequently occurs that the air pressure supply fails, so that an electrical power supply, for example for determining the control valve position, cannot be provided continuously. Furthermore it appears that changes in air pressure often also necessitate a complicated electrical control procedure for the power supply. Besides, control devices can also be actuated by electromotive drives.

SUMMARY

It is an object to overcome the disadvantages of the prior art, in particular to improve a control valve for adjusting a process medium flow of a technical process installation such that flow parameters of the process medium can be provided continuously and highly reliable over a long period without in particular having to accept a high expenditure for installing a self-sufficient power supply.

In a control valve for adjusting a process medium flow of a technical process installation, a housing is provided with an interior to be traversed by a process medium. A valve seat is disposed inside the housing interior. A valve member is provided obstructing or clearing the valve seat wherein a flow cross section of the control valve can be altered according to a relative position between the valve member and the valve seat for adjusting the process medium flow to initiate a pressure change in the process medium flow between an upstream and a downstream duct section. An electrical consumer is provided. A thermoelectric element is coupled to supply electrical power to the electrical consumer. The thermoelectric element is disposed at a position in the housing interior for generating the electrical power resulting from a temperature difference that accompanies a pressure difference at a location of said position of the thermoelectric element.

DESCRIPTION OF THE PREFERRED EXEMPLARY EMBODIMENTS

Figure 1:
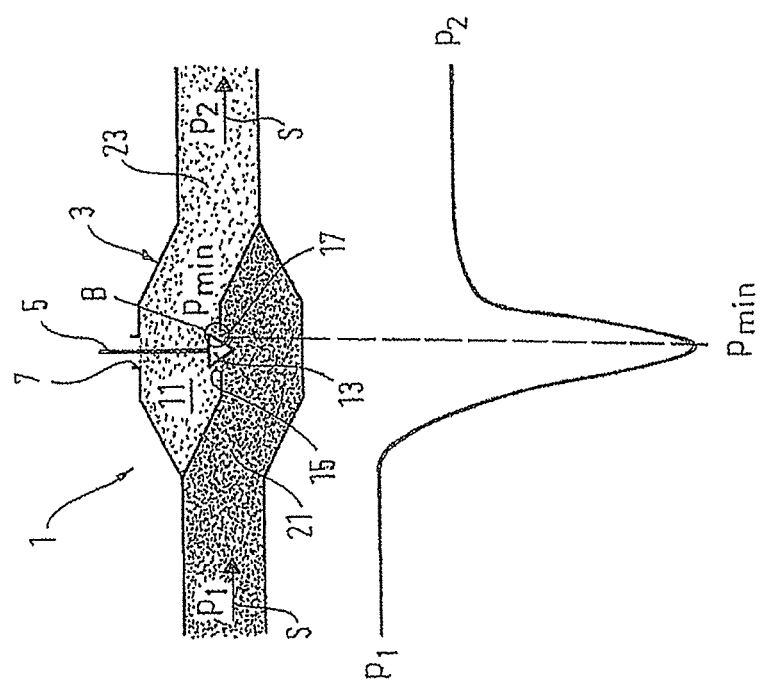
FIG. 1 is a technical schematic sketch of a control valve according to an exemplary embodiment and which is connected to an installation conduit of the technical process installation, wherein the pressure conditions over the path of the flow through the control valve are indicated by means of a line below the sketch.

For the purposes of promoting an understanding of the principles of the invention, reference will now be made to preferred exemplary embodiments/best mode illustrated in the drawings and specific language will be used to describe the same. It will nevertheless be understood that no limitation of the scope of the invention is thereby intended, and such alterations and further modifications in the illustrated embodiments and such further applications of the principles of the invention as illustrated as would normally occur to one skilled in the art to which the invention relates are included.

A control valve for adjusting a process medium flow of a technical process installation is provided having a housing with an interior to be traversed by the process medium. The housing can, for example, be comprised of a downstream conduit connector portion, an upstream conduit connector portion, a baffle that separates the two connector portions from each other and possibly forms or receives a valve seat delimiting the valve passage, and a sleeve at the side of the control valve drive that often tightly seals the housing and through which an actuator rod or an actuator shaft extends. The valve seat represents a throttling point with a defined geometry between the upstream conduit connector portion and the downstream conduit connector portion of the housing. At the upstream conduit connection as well as at the downstream conduit connection flange areas may be provided at which conduit pipes leading further within the technical process installation are to be connected. Furthermore, the control valve according to the exemplary embodiment has a valve member or stopper part, in particular a valve cone, obstructing or clearing the valve seat. The valve member serves to alter the in particular narrowest passage cross section at the baffle between the valve member and the valve seat, in particular to open or to close the latter, in order to adjust the process medium flow, for example according to a control routine, in particular to adjust a pressure drop between the pressure prevailing in the upstream conduit portion of the control valve and the downstream conduit portion.

Furthermore, the control valve according to the exemplary embodiment has an electrical consumer like a sensor, in particular a position sensor, a positioner, in particular a microchip, an electronic memory, a sender, an accumulator or the like. It shall be understood that the electrical consumer is to be considered as such also in the case that the control valve presents at least one electrical connection at which a consumer as named above can be connected.

The control valve according to the exemplary embodiment additionally has a thermoelectric element in the housing interior coupled to the electrical consumer for supplying electrical power. In this way electric power can be generated from the location of the disposal of the thermoelectric element, that is in direct vicinity to the valve member and/or to the valve seat in the housing interior, owing to a temperature difference that accompanies a pressure difference of the process medium flow. It became apparent during trials with thermoelectric elements in fluidic contact with the process medium flow that a constant, durable and reliable power supply is provided. This also holds if solid particles are entrained in the process medium flow, which causes a high level of wear for other power sources like turbines. According to the exemplary embodiment it is possible to provide fail-safe control valves that dispose of a self-sufficient power supply. Since for most control valve installations it can be expected that a process medium flow is maintained for at least a certain period even in case of a total power failure, an always ready power supply is available with the thermoelectric element in the interior of the control valve.

In order to obtain the highest possible energy yield from the thermoelectric element, preferably the thermoelectric element is to be disposed in a so-called "vena contracta" area, that is along a path of the flow traversing the control valve housing at a smallest flow cross section, in particular in a middle of the restricted flow channel.

With respect to an optimum arrangement, it is observed that a considerable temperature drop occurs within the process medium flow in the vicinity of metal components. In this way a simple and solid fitting is provided for mounting the thermoelectric element. Especially the valve cone, the valve member, or the valve seat can come into consideration as a mounting position for the thermoelectric element. Very good power generation results can be obtained if a high heat conductance at the mounting location of the thermoelectric element is exploited. It can be advantageous to provide the material of the mounting position for the thermoelectric element with a high thermal conductivity coefficient.

When the thermoelectric element is inserted a reference point is required, the fitting position of which is advantageously chosen to be in particular in the flow area at the side of the inlet of the control valve, for example either inside the flow channel or at a respective wall.

In a preferred exemplary embodiment several thermoelectric elements are disposed in the same control valve housing which can provide a larger energy recovery. Therein the thermoelectric elements may be connected in line with each other. It could, for example, be considered to mount an additional thermoelectric element also in the actuating air pressure circuit responsible for actuating the control valve.

In a preferred exemplary embodiment the thermoelectric element is positioned in the area of an especially narrow flow passage between the valve member and the valve seat. Since the position of the minimum flow passage cross section is variable depending on the position of the valve member, an in particular flat and/or foil-type thermoelectric element can be provided in order to ensure that in every position of the valve member the thermoelectric element is disposed in the area of the minimum flow passage cross section.

A thermoelectric element can also be disposed within the process medium flow in the passage between the valve member and the valve seat, i.e. at a distance therefrom. At the narrowest flow cross section the highest pressure drop and the highest temperature gradient is to be expected.

Furthermore, the thermoelectric element can be disposed at the valve member, in particular at an outer side of the valve member, and/or at the valve seat, in particular at an inside of the valve seat. The valve seat can be designed as a separately mountable component, like an insert sleeve, attached to an inner housing part, in particular with a screw connection, or is designed as an integral component of the inner housing part. The valve seat has a revolving sealing surface that can cooperate in a sealing manner with a respective revolving sealing surface of the valve member, obstructing the passage of the control valve. Provisions can be made to dispose a thermoelectric element at the position of the surface of the valve member and/or of the valve seat.

Preferably the thermoelectric element is disposed at a profiling like a step, an offset, an undercut of the valve seat and/or of the valve member. It became apparent that for such profilings supercritical flow conditions, which is where the largest temperature gradients occur, will arise first in case of a gradual increase of the pressure drop of the process medium.

In a further exemplary embodiment the thermoelectric element is positioned within a flow passage between the valve member and the valve seat at a distance from the latter, wherein in particular the point of disposal of the thermoelectric element is positioned downstream of the valve seat and/or of the valve member.

In another preferred exemplary embodiment the housing has a downstream conduit section and an upstream conduit section. The thermoelectric element can be positioned inside the downstream conduit section, in particular at a distance to a conduit wall and/or at an inner side of the conduit wall. In particular, the conduit wall to be used is the one reached first by the process medium flow after leaving the valve seat and/or to which the flow has the smallest distance.

The thermoelectric element can in particular be positioned at or in the area of an outer surface of the valve member facing the valve seat. This outer surface can be disposed at a lateral half of the valve member facing the downstream conduit section. In particular, in case of a rotosymmetrical, in particular cylindrical and/or cone-shaped valve member, the thermoelectric element is disposed at a tangential line at the outer surface of the valve member closest to the downstream conduit section, preferably aligned with the positioning direction of the valve member.

In another preferred exemplary embodiment of the invention the thermoelectric element is positioned at an inner side of the valve seat facing the valve member, which inner side is disposed at a lateral half close to the downstream conduit section. In case of a circular shaped valve seat, the area of disposal of the thermoelectric element is selected such that it is facing the upstream conduit section.

A thermoelectric element has a metal to metal contact as a basic structure, wherein electrical energy flows can be generated resulting from a temperature difference with respect to a reference point. In order to increase the electrical energy recovery the thermoelectric elements are preferably connected in large numbers in series.

In another preferred exemplary embodiment the thermoelectric element, in particular the thermoelectric series connection, forms a thin plate or film structure. In this way a large ratio between energy output and necessary space requirement can be achieved. The plate or film structure can be disposed and dimensioned such that at least a portion of it extends into an area of the largest pressure drop of the process medium flow along the flow.

The plate or film structure can be a silicon wafer structure. Therein the first layer, the wafer, is disposed at the side of the valve seat and/or at the side of the valve member, wherein the wafer is attached, in particular glued, to the respective outer surface. The silicon layer disposed above the wafer is positioned at the side of the process medium flow. A multitude of thermoelectric pairs of compound material may be introduced between the wafer and the silicon layer in a sandwich arrangement.

Furthermore the exemplary embodiment relates to a method for providing electrical power for an electrical consumer like an I/P converter, a positioner, a sensor, like a position sensor, a wireless transmission or the like. In particular, the provision of electrical power can be for the electrical consumer of a control valve. The conduit system of the technical process installation is/comes to be provided with a cross section restriction that is for example formed by a fixed baffle for flow measurement or a throttling point of the process valve, in particular one according to exemplary embodiment. According to the exemplary embodiment a thermoelectric element is disposed within the process flow in the area of the cross section restriction, for example directly downstream from it, which element is being coupled to the electrical consumer for supplying electrical power, and electrical power is generated at the location of the disposal of the thermoelectric element by means of a temperature difference that accompanies a pressure difference, to be conducted to the electrical consumer.

In case of the disposal of the thermoelectric element inside the housing of a control valve, the latter has a valve seat and a valve member obstructing or clearing the valve seat. A flow cross section of the control valve can be altered according to the relative position between the valve member and the valve seat. In this way a pressure change in the process medium flow, in particular between the upstream and the downstream duct section, can be initiated. The electrical consumer shall be supplied by the provided energy. In the inside of the housing a thermoelectric element is disposed, immersed in the stream of the process medium. The thermoelectric element is coupled to the electrical consumer. At the location of the disposal of the thermoelectric element electrical power is generated by the thermoelectric element by means of a temperature difference that accompanies a pressure difference, to be conducted to the electrical consumer.

Further aspects of the method are defined by the functionality of the control valve according to the exemplary embodiments.

Further characteristics, advantages and features of the exemplary embodiments are apparent from the following description of preferred exemplary embodiments in conjunction with the attached drawings.

In FIG. 1 a control valve 1 according to an exemplary embodiment is represented schematically in so far as it comprises a housing 3. The control valve 1 is actuated by a pneumatic control drive not represented in detail. The actuating rod 5 of the drive enters the inside 11 of the housing 3 through an opening 7 formed in the housing and has at its end and in particular cone shaped valve member 13. The pneumatic control drive is controlled by a positioner (not represented) that moves the valve member 13 up and down in order to adjust the process medium flow S.

In the inside of the housing 3 of the control valve 1 a valve seat 15 is provided that cooperates with the valve member 13 for obstructing a valve passage 17.

The valve seat 15 structurally separates an upstream conduit section 21 from a downstream conduit section 23 of the housing 3 of the control valve 1. In this way the control valve generates, as a function of the position of the valve member 13, a pressure drop between the flow pressure $p^1$ prevailing in the upstream conduit section 21 and the flow pressure $p^2$ prevailing in the downstream conduit section 21. The largest pressure drop is to be expected in the circle B, wherein the value of the flow pressure P is represented qualitatively below the schematic sketch in FIG. 1 by the path of the graph.

The minimum pressure pmin prevails in the area of the minimum passage cross section between the valve seat 15 and the valve member 13, that is in particular the passage area downstream with respect to the valve member sides, indicated by the delimited circle line B in FIG. 1.

It is to be noted that in particular at the narrowest passage cross section between the valve seat 15 and the valve member 13 a supercritical flow may occur. It became apparent that this supercritical flow condition occurs when a pressure difference of $p^1$ to $p^2$ of about 0.50 to 056 is underrun, depending on a gaseous process medium type.

For the control valve 1 according to the exemplary embodiment a so-called thermoelectric element is to be provided in the area of the expected largest medium velocity, which corresponds to the lowest pressure (largest pressure drop), wherein the thermoelectric element utilizes a temperature difference for generating electrical power.

It appears that in the downstream passage area between the valve member 13 and the valve seat 15 the largest temperature gradient is reached during the occurrence of supercritical flow, whereby a sufficiently large power supply is provided for example for the operation of a position sensor or other electronic components. It shall be understood that the thermoelectric element is also to be disposed at other locations within the control valve housing where a sufficiently large pressure drop and thus a sufficiently large temperature gradient is produced, for example making use of built-in baffles or other cross section restrictions. Particularly advantageous are cross section restrictions in which a supercritical flow can be expected.

For a test arrangement with a baffle (baffle diameter of 5 mm, environmental temperature of 23° C., temperature of the process medium of 26.5° C. in the upstream area) it is found that also in the case of different pressure drops ranging from 1.5 bar to 4 bar an essentially similar pressure drop characteristic in the baffle area can always be achieved. In this way the use of the thermoelectric element can ensure that also for different operational conditions of the technical process installation, in particular of the process medium flow, an uninterrupted and constant power supply is continuously provided. A complicated preceding electronic circuitry with a large amount of components is not necessary. It became apparent that a thermoelectric element inside the process medium flow is very well suited to generate power for electronic components in the direct vicinity of the control valve, like a position sensor, a signal sender, a positioner, an I/P converter etc.

Figure 3:
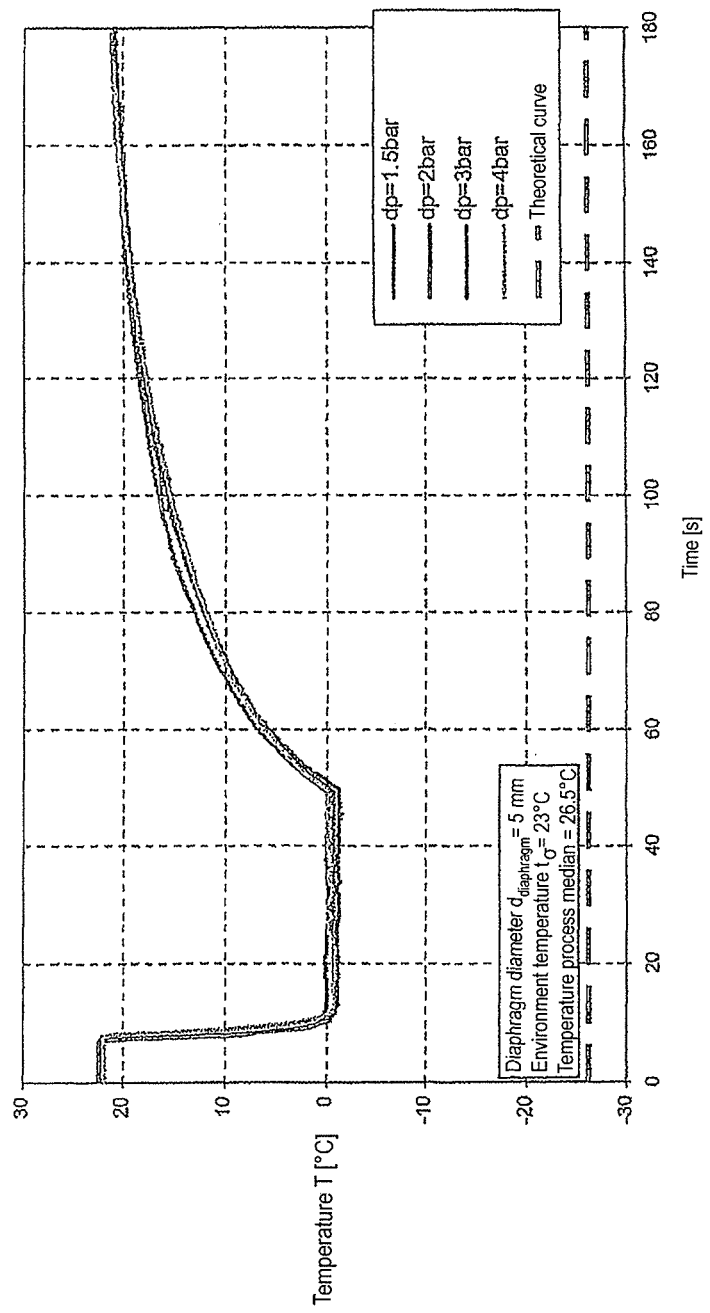
FIG. 3 is a graph showing a temperature recording at a control valve over time for different differential pressures between an upstream and a downstream location at the control valve according to the exemplary embodiment.

In FIG. 3 a graph is shown representing the measured temperature at a baffle for different pressure drops within the process medium of 1.5 bar to 4 bar. As evident from the graph, a temperature profile relatively void of deviations is achievable even for low process medium flow pressures, whereby a reliable and predictable power generation by the thermoelectric element is ensured. Consequently, even for the strong variation of the process medium flow a constant power supply can be achieved for the electrical consumer. The straight dashed (theoretic) line at about −26° C. shown in FIG. 3 represents the theoretic course of the temperature over time, which temperature would occur for an adiabatic isentropic relaxation with respect to the initial temperature according to mathematical iteration.

Figure 2:
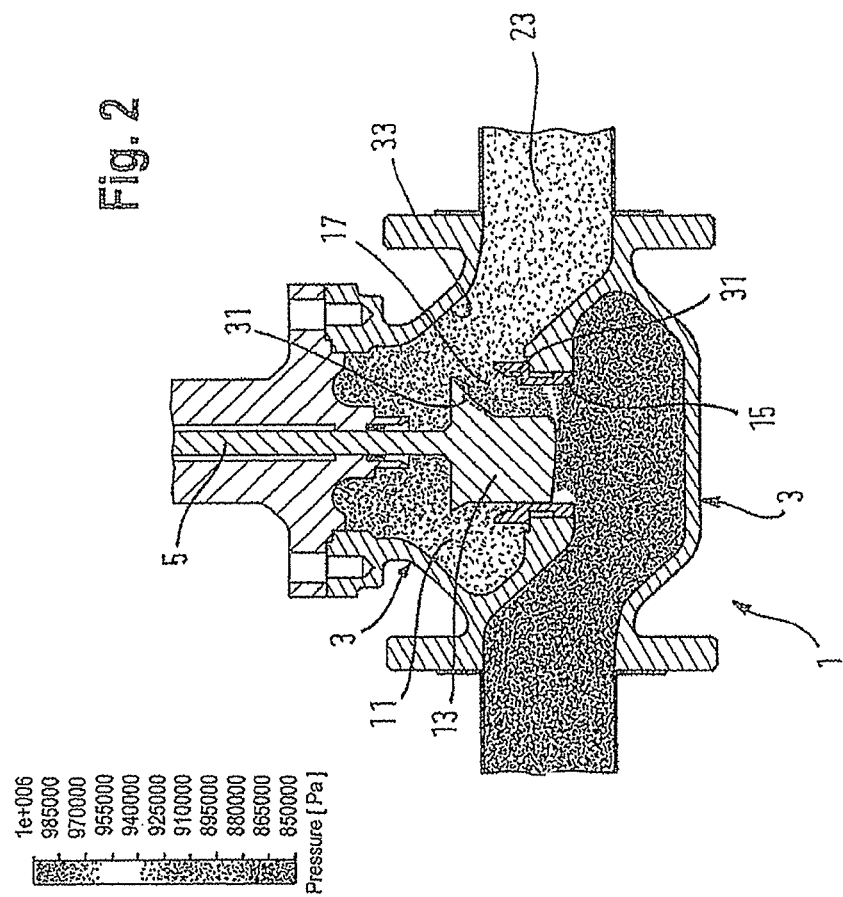
FIG. 2 is a cross-sectional view of a control valve fitted in a technical process installation, wherein within the conduits and at the control valve, pressure conditions of the process fluid are represented graphically.

FIG. 2 shows a cross-sectional view of a control valve according to the exemplary embodiment according to the schematic sketch in FIG. 1.

By means of graphical representation the prevailing pressure is indicated within the control valve, wherein it is noticeable that very large pressures prevail in the conduit section 21, upstream with respect to the valve seat 15, while low pressure prevails in the downstream conduit section. The valve seat 15 is inserted as a separate component at an inner housing part of the control valve 1, in particular by means of a screw connection.

Directly at the valve seat 15 distinctively lower pressures prevail.

In so far, a suitable location for disposing the thermoelectric element, having reference numeral 31, is for example within the passage 17 at the smallest cross-sectional area between the valve member 13 and the valve seat 15. A further suitable position is the outer surface of the cone-shaped valve member 13, in particular in case that a flat thermoelectric element is used. The thermoelectric element can then extend across a large area of the valve member 13.

As visible in FIG. 2, the passage 17 is provided rather at the downstream side of the valve member 13, which is why the suitable area for the thermoelectric element is at that location. Furthermore, the thermoelectric element can be disposed within the passage 17 or also within the downstream conduit section 23 or at its inner surface 33, which is where higher temperature gradients can be expected.

If the thermoelectric element is disposed at the valve member 13, an electric line, like a cable, (not represented) can lead to an electrical consumer via the valve member 13 and the actuator rod 5. Similarly, in case of a disposal of the thermoelectric element 31 at the inside of the valve seat 15, the electric line can correspondingly be laid through sections of the housing 3 of the control valve 1.

Advantageously the thermoelectric element can be comprised of many individual elements preferably formed by a thin film structure and having a thickness of a few millimeters, preferably 1 to 2 mm. As an example of a thin film generator the product MPG-D651 or MPG-D751 of the company Mikropelt GmbH can be cited. Such a thin film generator is formed in a kind of sandwich structure in which a heat plate as well as a silicon substrate are superimposed on each other, wherein between the two layers so-called n-legs and p-legs are disposed.

These thin film generators are particularly suitable to be disposed directly at the inner/outer surface of the valve seat 15 or the valve member 13.

It became apparent that electrical power of a few milliwatts, in particular up to 20 mW and more, can be achieved with the thermoelectric elements within the process medium flows.

The features disclosed in the above description, the figures and the claims can be relevant for the realization of many different exemplary embodiments individually as well as in any combination.

Although preferred exemplary embodiments are shown and described in detail in the drawings and in the preceding specification, they should be viewed as purely exemplary and not as limiting the invention. It is noted that only preferred exemplary embodiments are shown and described, and all variations and modifications that presently or in the future lie within the protective scope of the invention should be protected.

I claim as my invention:

1. A control valve for adjusting a flow of a process medium of a technical process installation, comprising:
   a housing with an interior to be traversed by the process medium;
   a valve seat disposed inside the housing interior;
   a valve member obstructing or clearing the valve seat wherein a flow cross section of the control valve can be altered according to a relative position between the valve member and the valve seat for adjusting the process medium flow in order to initiate a pressure change in the process medium flow between an upstream duct section and a downstream duct section;
   an electrical consumer; and
   a thermoelectric element coupled to supply electrical power to said electrical consumer, said thermoelectric element being disposed at a position in the housing interior for generating the electrical power resulting from a temperature difference that is directly and primarily created and caused by a pressure difference at a location of said position of the thermoelectric element.

2. The control valve of claim 1 wherein the valve seat comprises a valve cone.

3. The control valve of claim 1 wherein the electrical consumer is at least one of the elements selected from the group consisting of a sensor, a position sensor, a positioner, a microchip positioner, a sender, and an accumulator.

4. The control valve according to claim 1 wherein the thermoelectric element is positioned in an area of a minimum flow cross section between the valve member and the valve seat.

5. The control valve according to claim 1 wherein the thermoelectric element is disposed at the valve member or at the valve seat, and wherein the thermoelectric element is disposed at a profiling of the valve seat or of the valve member, at which profiling supercritical flow conditions arise in case of a gradual increase of a pressure drop of the process medium flow.

6. The control valve according to claim 1 wherein the thermoelectric element is positioned within a flow passage between the valve member and the valve seat at a spacing from the valve seat, and wherein said position of the thermoelectric element is in a passage downstream of the valve seat or of the valve member.

7. The control valve according to claim 1 wherein the valve seat separates the downstream duct section from the upstream duct section, and the thermoelectric element is positioned inside the downstream duct section, at a spacing from a duct wall or at an inner side of the duct wall.

8. The control valve according to claim 1 wherein the thermoelectric element is positioned at or in an area of an outer surface of the valve member facing the valve seat, said outer surface being disposed at a lateral half facing the downstream duct section, said valve member being rotosymmetrical, and the thermoelectric element being at a tangential line closest to the downstream duct section and aligned with a positioning direction of the valve member.

9. The control valve according to claim 1 wherein the thermoelectric element is positioned at an inner side of the valve seat facing the valve member, said inner side being disposed at a lateral half close to the downstream duct section, said valve seat being circular shaped, and said thermoelectric element being disposed in an area facing the upstream duct section.

10. The control valve according to claim 1 wherein the thermoelectric element forms a thin plate structure that is disposed such that at least a portion of the plate structure extends into an area of a largest pressure drop of the process medium flow along a path of the flow.

11. The control valve according to claim 10 wherein the plate structure of the thermoelectric element forms a silicon wafer structure, the wafer structure being disposed at a side of the valve seat or at a side of the valve member, and a silicon layer of the wafer structure being positioned at a side of the process medium flow.

12. A method for providing electrical power for an electrical consumer of a control valve for adjusting a flow of a process medium for a technical process installation, said control valve having at least one cross section restriction which can be altered if required, comprising the steps of:
providing a thermoelectric element disposed at the cross section restriction, said element being coupled to the electrical consumer for supplying electrical power thereto; and
generating said electrical power at a location of a disposal of the thermoelectric element by means of a temperature difference that is directly and primarily created and caused by a pressure difference.

13. The method according to claim 12 wherein the control valve has a valve seat.

14. The method according to claim 13 wherein the valve seat comprises a valve cone.

15. The method according to claim 12 wherein the electrical consumer is at least one of the elements selected from the group consisting of a sensor, a position sensor, a positioner, a microchip positioner, a sender, and an accumulator.

16. The method according to claim 13 wherein the thermoelectric element is positioned in an area of a minimum flow cross section between a valve member of the control valve and the valve seat.

17. The method according to claim 13 wherein the thermoelectric element is disposed at a valve member of the control valve or at the valve seat, and wherein the thermoelectric element is disposed at a profiling of the valve seat or of the valve member, at which profiling supercritical flow conditions arise in case of a gradual increase of a pressure drop of the process medium flow.

18. The method according to claim 13 wherein the thermoelectric element is positioned within a flow passage between a valve member of the control valve and the valve seat at a spacing from the valve seat, and wherein said position of the thermoelectric element is in a passage downstream of the valve seat or of the valve member.

19. The method according to claim 13 wherein the valve seat separates a downstream duct section from an upstream duct section, and the thermoelectric element is positioned inside the downstream duct section, at a spacing from a duct wall or at an inner side of the duct wall.

20. The method according to claim 13 wherein the thermoelectric element is positioned at or in an area of an outer surface of a valve member of the control valve facing the valve seat, said outer surface being disposed at a lateral half facing a downstream duct section, said valve member being rotosymmetrical, and the thermoelectric element being at a tangential line closest to the downstream duct section and aligned with a positioning direction of the valve member.

21. The method according to claim 13 wherein the thermoelectric element is positioned at an inner side of the valve seat facing a valve member of the control valve, said inner side being disposed at a lateral half close to a downstream duct section, said valve seat being circular shaped, and said thermoelectric element being disposed in an area facing an upstream duct section.

22. The method according to claim 13 wherein the thermoelectric element forms a thin plate structure that is disposed such that at least a portion of the plate structure extends into an area of a largest pressure drop of the process medium flow along a path of the flow.

23. The method according to claim 22 wherein the plate structure of the thermoelectric element forms a silicon wafer structure, the wafer structure being disposed at a side of the valve seat or at a side of a valve member of the control valve, and a silicon layer of the wafer structure being positioned at a side of the process medium flow.

24. A method for providing electrical power for an electrical consumer of a control valve for adjusting a flow of a process medium for a technical process installation, said control valve having a housing with an interior to be traversed by the process medium, a valve seat disposed inside the housing interior, a valve member obstructing or clearing the valve seat wherein a flow cross section of the control valve can be altered according to relative position between the valve member and the valve seat for adjusting the process medium flow in order to initiate a pressure change in the process medium flow between an upstream duct section and a downstream duct section, comprising the steps:
providing a thermoelectric element coupled to supply electrical power to said electrical consumer; and
positioning said thermoelectric element at a position in the housing interior for generating the electrical power resulting from a temperature difference that is directly and primarily created and caused by a pressure difference at a location of said position of the thermoelectric element.

* * * * *